United States Patent
Zhang et al.

(10) Patent No.: US 9,520,879 B2
(45) Date of Patent: Dec. 13, 2016

(54) ADAPTIVE BLANKING TIMER FOR SHORT CIRCUIT DETECTION

(71) Applicant: Texas Instruments Incorporated, Dallas, TX (US)

(72) Inventors: Ruochen Zhang, Shanghai (CN); Xiaofan Qiu, Shanghai (CN); Jingwei Xu, Plano, TX (US); Qingjie Ma, Shanghai (CN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/742,540

(22) Filed: Jun. 17, 2015

(65) Prior Publication Data

US 2015/0372678 A1 Dec. 24, 2015

Related U.S. Application Data

(60) Provisional application No. 62/013,642, filed on Jun. 18, 2014.

(51) Int. Cl.
 *H03B 1/00* (2006.01)
 *H03K 19/0175* (2006.01)

(52) U.S. Cl.
 CPC .................. *H03K 19/017509* (2013.01)

(58) Field of Classification Search
 CPC .............. A61K 2300/00; C07D 243/08; H01L 21/823814
 See application file for complete search history.

(56) References Cited

U.S. PATENT DOCUMENTS

2015/0116006 A1* 4/2015 Ferianz .................. H03K 17/04 327/109

* cited by examiner

*Primary Examiner* — Sibin Chen
(74) *Attorney, Agent, or Firm* — Lawrence J. Bassuk; Charles A. Brill; Frank D. Cimino

(57) ABSTRACT

A gate driver IC for driving an NMOS transistor having a drain coupled through a load to a power supply. A gate driver output drives the gate of the NMOS transistor. A comparator receives the drain voltage of the NMOS transistor and compares it to a reference voltage representative of a short circuit condition between the drain and the power supply. The comparator outputs a first value if the drain voltage is greater than the reference voltage and outputs a second value if the drain voltage is less than or equal to the reference voltage. Control circuitry receives the output of the first comparator and pulls the voltage of the gate driver output low if the comparator output is of the first value. Adaptive masking circuitry is operable, upon an application of an "on" signal to the gate driver output, to mask the output of the comparator such that a condition of the drain voltage being greater than the reference voltage does not cause the control circuitry to pull the voltage of the gate driver output low. The adaptive masking circuitry detects a Miller plateau in the gate voltage of the external NMOS transistor. The adaptive masking circuitry stops masking the output of the comparator after the end of the Miller plateau.

6 Claims, 5 Drawing Sheets

ADAPTIVE BLANKING TIMER FOR SHORT CIRCUIT DETECTION

CROSS-REFERENCE TO RELATED APPLICATIONS

This application claims priority under 35 U.S.C. §119 to U.S. Provisional Patent Application 62/013,642 for ADAPTIVE BLANKING TIMER FOR SHORT CIRCUIT DETECTION, filed on Jun. 18, 2014, the contents of which are hereby incorporated herein by reference.

BACKGROUND

A gate driver circuit is a specialized circuit that accepts a low-power input and produces a high-current drive input for the gate of a high-power transistor such as a power metal-oxide-semiconductor field-effect transistor (MOSFET). Gate drivers can be provided either on-chip or as a discrete module.

In order to protect the external transistor from overheating in the event of a short circuit between the transistor's drain and its power supply, certain gate driver integrated circuits monitor the drain voltage and compare it to a reference voltage that is representative of a short circuit condition. If the drain-source voltage exceeds the reference voltage when the transistor is turned on, the gate driver circuit pulls the gate-source voltage low in order to turn off the transistor and limit damage caused by excessive heat generation. However, during normal switching on of the external transistor, the drain-source voltage takes a certain period of time to decay to a level that is less than the reference voltage due to the slew rate of the drain voltage. Thus, certain gate driver integrated circuits employ a blanking timer that, for a predetermined fixed amount of time following the switching on of the transistor, prevents the short circuit detection circuitry from causing the transistor to be turned off. Such a blanking timer needs to implement a fixed blanking time that is both long enough to cover normal switch-on stewing time, and short enough to prevent excessive heat generation in the event of an actual drain-to-power-supply short circuit from damaging the device. In some cases it is not possible to satisfy both of these requirements.

SUMMARY

Embodiments of this disclosure are directed to gate driver integrated circuits for driving an external MOSFET transistor. An illustrative gate driver IC for driving an NMOS transistor having a drain coupled through a load to a power supply includes a gate driver output, a comparator, control circuitry, and adaptive masking circuitry. The gate driver output drives the gate of the external NMOS transistor. The comparator receives the drain voltage of the external NMOS transistor and compares it to a reference voltage representative of a short circuit condition between the drain and the power supply. The comparator outputs a first value if the drain voltage is greater than the reference voltage and outputs a second value if the drain voltage is less than or equal to the reference voltage. The control circuitry receives the output of the first comparator and pulls the voltage of the gate driver output low if the comparator output is of the first value. The adaptive masking circuitry is operable, upon an application of an "on" signal to the gate driver output, to mask the output of the comparator such that a condition of the drain voltage being greater than the reference voltage does not cause the control circuitry to pull the voltage of the gate driver output low. The adaptive masking circuitry detects a Miller plateau in the gate voltage of the external NMOS transistor. The adaptive masking circuitry stops masking the output of the comparator after the end of the Miller plateau.

DETAILED DESCRIPTION

Figure 1:
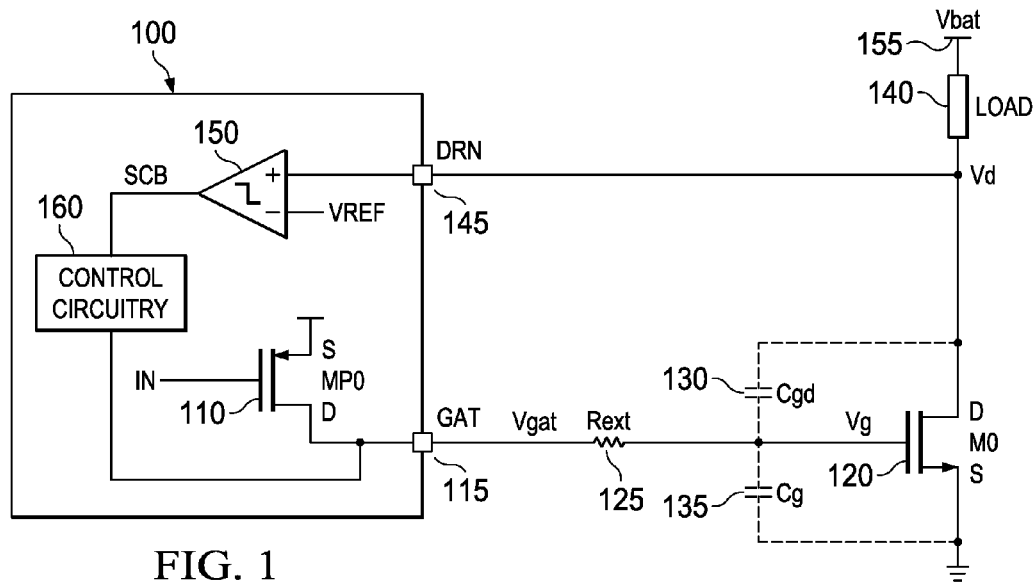
FIG. 1 is schematic circuit diagram illustrating a gate driver integrated circuit coupled to drive an external MOSFET transistor.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is schematic circuit diagram illustrating a gate driver integrated circuit 100 coupled to drive an external MOSFET transistor 120. The gate driver integrated circuit 100 includes a gate driver transistor 110. In the illustrative circuit of FIG. 1, gate driver transistor 110 is a p-type MOSFET (PMOS) transistor, but other transistor types can also be used, including both NMOS transistors and non-MOSFET transistors. The drain of the PMOS transistor 110 is coupled to a gate pin (GAT) 115 of the integrated circuit 100. The gate pin 115 is in turn coupled to the gate of an external transistor 120 through an external resistor 125. In the illustrative circuit of FIG. 1, external transistor 120 is an s-type MOSFET (NMOS) transistor, but other transistor types can also be used, including both PMOS transistors and non-MOSFET transistors. The gate driver transistor 110 receives an input signal at its gate and drives the gate of the external NMOS transistor 120 with a desired voltage and current. A load 140 is connected between the drain of the NMOS transistor 120 and power supply 155. The power supply 155 is designated as $V_{bat}$, referring to a battery power supply. However, it will be appreciated that the power supply 155 can also comprise other, non-battery, power sources.

The drain pin (DRN) 145 of the gate driver integrated circuit 145 is used to monitor the drain voltage $V_d$ of the NMOS transistor 120. The drain voltage $V_d$ is provided to a comparator 150 which compares the drain voltage to a predetermined reference voltage $V_{REF}$ that is representative of a short circuit condition between the drain and the power supply 155. The comparator outputs a signal, labelled SCB (short circuit to battery) in FIG. 1, that indicates if the drain is short circuited to the power supply 155. Illustratively, if the drain voltage is greater than the reference voltage, SCB=1, otherwise SCB=0. The SCB signal is provided to control circuitry 160. If the SCB signal indicates a drain-to-power-supply short circuit condition, the control circuitry 160 pulls the voltage of the gate pin 115 low in order to turn off the external transistor 120 and prevent or limit damage to the external transistor 120 due to overheating.

Figure 2:
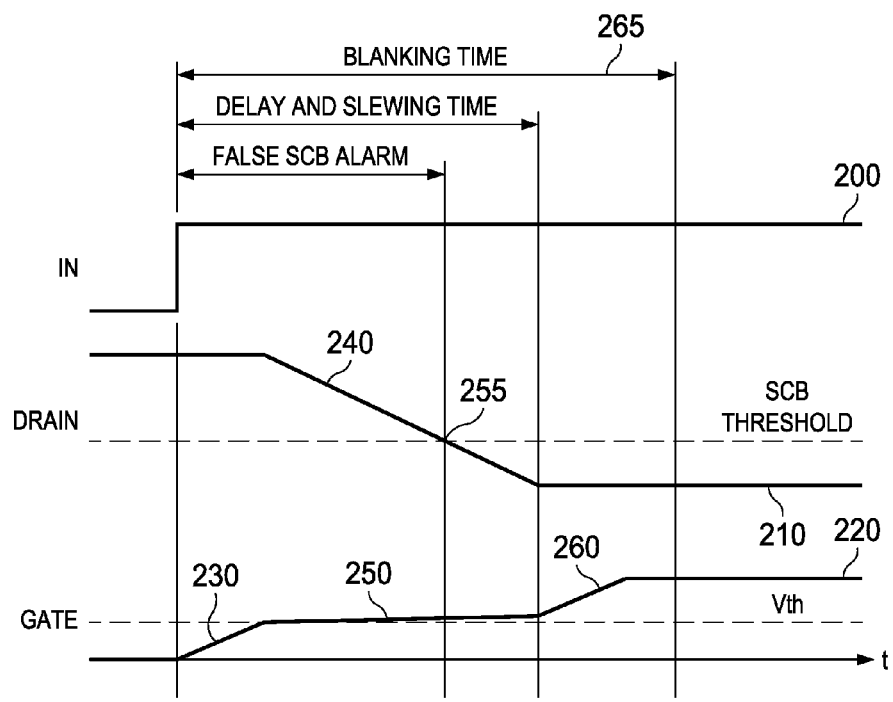
FIG. 2 is a timing diagram representing the values of an input signal provided to the gate of a gate driver transistor, the drain voltage of an external transistor, and the gate voltage of the external transistor during a normal switching-on of the external transistor.

During the OFF state of the external transistor 120, there is no current through the load 140, and therefore the drain voltage $V_d$ of the external transistor 120 floats to the level of the power supply 155. Thus during normal switching on of the external transistor 120, the drain voltage $V_d$ of the external transistor 120 starts at a level at or near the power supply voltage. Upon switching on the external transistor 120, the drain-to-source voltage $V_d$ takes a certain period of time to decay to a level that is less than the SCB reference voltage $V_{REF}$ due in part to the slew rate of the drain voltage. This is demonstrated in FIG. 2, which is a timing diagram representing the values of the input signal 200 provided to the gate of the gate driver transistor 110, the drain voltage $V_d$ 210 of the external transistor 120, and the gate voltage $V_g$ 220 of the external transistor 220 during a normal switching-on of the external NMOS transistor 120. To turn on the external transistor 120, an input signal 200 is applied to the gate of the gate driver transistor 110. As can be seen in FIG. 2, the drain voltage $V_d$ starts at a level at or near the power supply 155 voltage. When the input signal 200 goes high, the gate voltage $V_g$ of the external transistor 120 gradually begins to charge. The reason for this gradual charging is the inherent parasitic capacitance between the gate and drain, and between the gate and source, of external transistor 120. These parasitic capacitances are represented in FIG. 1 by the capacitors shown in dotted lines—gate-to-drain capacitance $C_{gd}$ 130 and gate-to-source capacitance $C_{gs}$ 135. When the gate voltage $V_g$ 210 reaches the on/off threshold $V_{th}$, of the transistor 120, the transistor begins conducting and therefore the drain voltage $V_d$ 210 begins dropping. During the time that the drain voltage $V_d$ 210 is discharging, the gate voltage $V_g$ remains relatively flat. This is known as the Miller plateau and is shown in FIG. 2 at 250. Once the drain voltage $V_d$ has dropped to its minimum value, turning the transistor 120 fully on, the gate voltage $V_g$ starts rising again, as shown at 260 in FIG. 2, again limited by the slewing caused by the parasitic capacitances $C_{gd}$ 130 and $C_{gs}$ 135, until the gate becomes fully charged.

It can be seen in FIG. 2 that the drain voltage $V_d$ remains above the short-circuit-to battery (SCB) threshold $V_{REF}$ for an appreciable amount of time until it crosses the SCB threshold at point 255 in FIG. 2. Thus from the time the external transistor 120 begins switching on, until the drain voltage $V_d$ crosses the SCB threshold $V_{REF}$ at point 255, the comparator 150 outputs an SCB signal indicating a short circuit condition between the drain of transistor 120 and the power supply 155, when in fact there is no short circuit between the drain and the power supply 155.

In order to prevent a false short-circuit-to-battery alarm from turning off the external transistor 120 every time the transistor is switched on, a blanking timer, or masking timer, can be used which prevents the short-circuit-to-battery signal SBE from being provided to the control circuitry 160, or prevents the control circuitry 160 detection circuitry from responding to the SBE signal, for a prescribed period of time after an ON signal is provided to the gate of the gate driver transistor 110. Existing blanking timers use a fixed blanking (masking) time of a predetermined fixed duration. Such a fixed blanking timer must employ a relatively long blanking time in order to cover the long clewing period of the drain voltage $V_d$, and also to provide a buffer that allows for the fact that the slew rate of the drain voltage $V_d$ can vary due to a variety of factors. For example, the fixed blanking time 265 shown in FIG. 2 masks the short-circuit-to-battery condition until well after the gate voltage $V_g$ 220 is fully charged.

Figure 3:
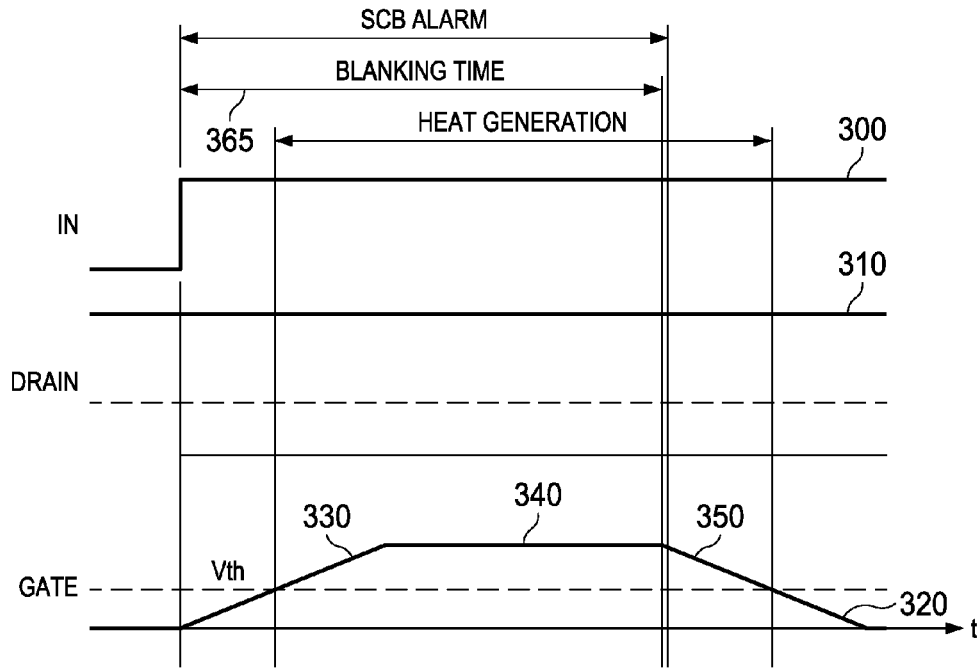
FIG. 3 is a timing diagram representing the values of an input signal provided to the gate of a gate driver transistor, the drain voltage of an external transistor, and the gate voltage of the external transistor during a switching-on of the external transistor while there is a short circuit between the drain of the transistor and the power supply.

However, one drawback to using a relatively long fixed blanking time is that if an actual short circuit occurs between the drain of the transistor 120 and the power supply 155, the masking of this condition by the blanking timer will prevent the external transistor 120 from being switched off for the duration of the blanking timer, which will cause significant heat generation in the external transistor 120, which can severely damage the transistor 120. FIG. 3 is a timing diagram representing the values of the input signal 300 provided to the gate of the gate driver transistor 110, the drain voltage $V_d$ 310 of the external transistor 120, and the gate voltage $V_g$ 320 of the external transistor 220 during a switching-on of the external NMOS transistor 120 while there is a short circuit between the drain of the transistor 120 and the power supply 155. In the illustrative example of FIG. 3, there is a short circuit condition existing between the drain of the external transistor 120 and the power supply 155 prior to the assertion of the ON signal at the gate of the gate driver transistor 110. As in FIG. 2, the drain voltage $V_d$ 310 starts at a level at or near the power supply 155 voltage. When the input signal 300 goes high, the gate voltage $V_g$ of the external transistor 120 begins to charge, with voltage slowing 330 caused by the parasitic capacitances $C_{gd}$ 130 and $C_{gs}$ 135. When the gate voltage $V_g$ 310 reaches the on/off threshold $V_{th}$ of the transistor 120, the transistor begins conducting but the drain voltage $V_d$ 310 remains at the voltage level of the power supply 155 due to the short circuit condition. Because the drain voltage $V_d$ does not fall, there is no Miller plateau in the gate voltage $V_g$ and the gate voltage $V_g$ continues to rise until the gate is fully charged.

As soon as the gate voltage $V_g$ crosses the on/off threshold $V_{th}$, significant amounts of heat begin being generated in the transistor 120 because the transistor is conducting with the drain voltage $V_d$ at the elevated level of the power supply voltage. All the while this is happening, the comparator 150 is generating a short-circuit-to-battery alarm SCB because the drain voltage $V_d$ is greater than the reference voltage $V_{REF}$, but the SCB signal is ignored because it is being masked by the blanking timer. When the blanking time 365 expires, the control circuit 160 detects the short circuit condition indicated by the SCB signal and pulls the voltage of the gate pin 115 low. The gate voltage $V_g$ 320 of the external transistor 120 then begins dropping at a rate that is limited by the discharging of the parasitic capacitances $C_{gd}$ 130 and $C_{gs}$ 135. When the gate-to-source voltage $V_{gs}$ 320 drops below the on/off threshold $V_{th}$, the transistor 120 stops conducting. Thus, the short circuit condition in the presence of the blanking timer results in significant heat generation from a time period starting when $V_g$ rises above $V_{th}$, continuing while the gate is fully charged 340, and ending when $V_g$ drops below $V_{th}$ again.

Thus with the fixed blanking timer, it is necessary to strike a balance between a blanking time that is both long enough to cover normal switch-on slewing time, and short enough to prevent excessive heat generation in the event of an actual drain-to-power-supply short circuit. In some cases it is not possible to satisfy both of these requirements.

In illustrative aspects of the present disclosure, rather than using a fixed blanking time, an adaptive blanking time, that is based on the detection of the Miller plateau in the gate voltage $V_g$ during the transistor's switching-on phase, is used. A sensing circuit is used to detect the Miller plateau. Referring again to FIG. 2, the Miller plateau 250 is a flattening of the gate voltage $V_g$ as it rises after the switching on of the transistor that is caused by, and happens concurrently with, the discharging of the drain voltage $V_d$ 240. When such a Miller plateau is detected, it is inferred that the drain voltage $V_d$ is slewing as opposed to being in a short circuit condition, and thus it is safe to mask the output of the short circuit detection circuitry such as comparator 150. When the Miller plateau ends, the masking of the output of the drain-to-power-supply short circuit detection circuitry such as comparator 150 is ceased, thus allowing the control circuitry 160 to respond appropriately to any detected short between the drain of the external transistor 120 to the power supply 155. In some embodiments, after the Miller plateau ends, some additional amount of time is waited prior to ceasing the masking of the output of the short circuit detection circuitry, in order to allow for any impreciseness in the detection of the Miller plateau and it's ending point.

Figure 4:
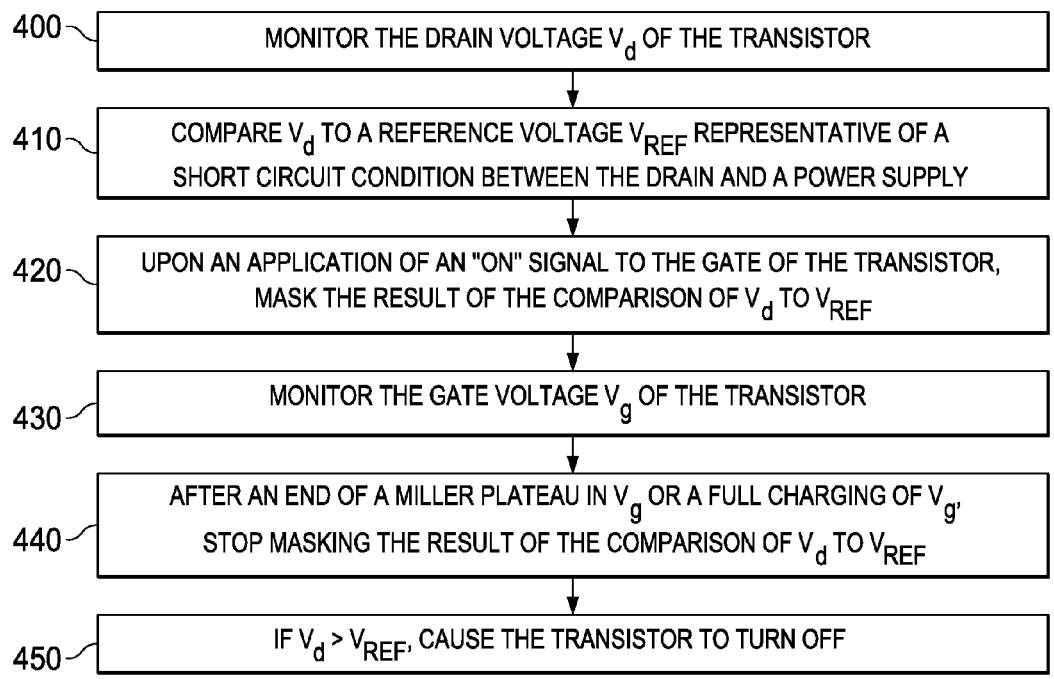
FIG. 4 is a flowchart representing a method of driving an NMOS transistor having a drain that is coupled through a load to a power supply.

FIG. 4 is a flowchart representing a method of driving an NMOS transistor having a drain that is coupled through a load to a power supply. At block 400, the drain voltage $V_d$ of the NMOS transistor is monitored. At block 410, the drain voltage is compared to a reference voltage $V_{ref}$ representative of a short circuit condition between the drain and the power supply. At block 420, if the drain voltage is greater than the reference voltage, the transistor is caused to turn off. At block 430, upon an application of an "on" signal to the gate of the transistor, the result of the comparison of the drain voltage to the reference voltage is masked such that a condition of the drain voltage being greater than the reference voltage does not cause the transistor to be turned off. At block 440, the gate voltage $V_g$ of the transistor is monitored. At block 450, the result of the comparison of the drain voltage to the reference voltage is continued to be masked until an end of a Miller plateau in the gate voltage or a full charging of the gate voltage.

Figure 5:
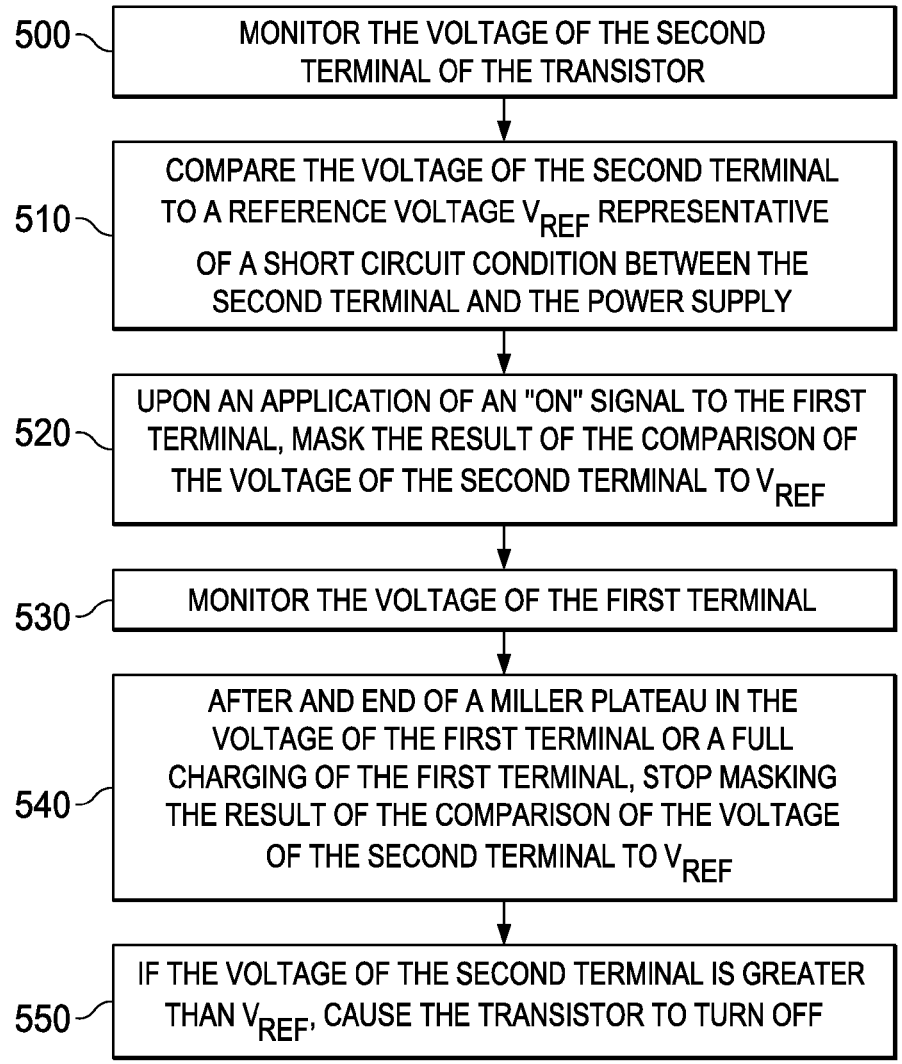
FIG. 5 is a flowchart representing a method of driving a transistor having a first terminal, a second terminal and a third terminal, wherein a voltage at the first terminal controls the flow of current from the second terminal to the third terminal, the second terminal being coupled through a load to a power supply.

FIG. 5 is a flowchart representing a method of driving a transistor having a first terminal, a second terminal and a third terminal, wherein a voltage at the first terminal controls the flow of current from the second terminal to the third terminal, the second terminal being coupled through a load to a power supply. At block 500, the voltage of the second terminal of the transistor is monitored. At block 510, the voltage of the second terminal is compared to a reference voltage representative of a short circuit condition between the second terminal and the power supply. At block 520, if the voltage of the second terminal is greater than the reference voltage, the transistor is caused to turn off. At block 530, upon an application of an "on" signal to the first terminal of the transistor, the result of the comparison of the voltage of the second terminal to the reference voltage is masked such that a condition of the voltage of the second terminal being greater than the reference voltage does not cause the transistor to be turned off. At block 540, the voltage of the first terminal of the transistor is monitored. At block 550, the masking of the result of the comparison of the voltage of the second terminal to the reference voltage is continued until an end of a Miller plateau in the voltage of the first terminal or a full charging of the first terminal.

Figure 6:
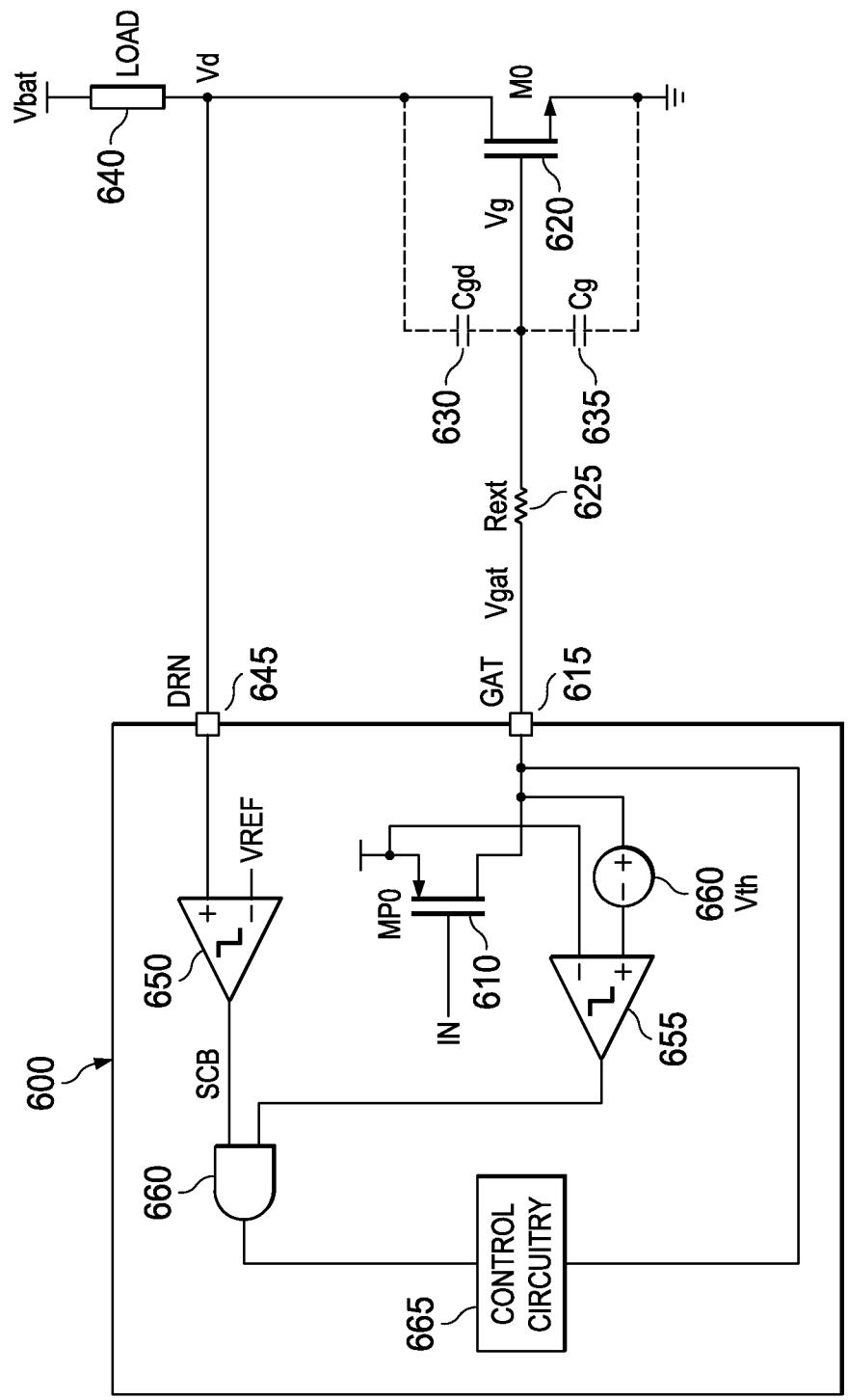
FIG. 6 is schematic circuit diagram illustrating a gate driver integrated circuit with adaptive blanking time coupled to drive an external MOSFET transistor.

FIG. 6 is schematic circuit diagram illustrating a gate driver integrated circuit 100 with adaptive blanking time coupled to drive an external MOSFET transistor 120. FIG. 6 illustrates one contemplated method of detecting the Miller plateau and using it to implement an adaptive blanking time. However, it will be appreciated by those of skill in the art that any number of different methods could be used to detect the Miller plateau. The gate driver integrated circuit 600 includes a gate driver transistor 610. In the illustrative circuit of FIG. 6, gate driver transistor 610 is a p-type MOSFET (PMOS) transistor, but other transistor types can also be used, including both NMOS transistors and non-MOSFET transistors. The drain of the PMOS transistor 610 is coupled to a gate pin (GAT) 615 of the integrated circuit 600. The gate pin 615 is in turn coupled to the gate of an external transistor 620 through an external resistor 625. In the illustrative circuit of FIG. 6, external transistor 620 is an n-type MOSFET (NMOS) transistor, but other transistor types can also be used, including both PMOS transistors and non-MOSFET transistors. The gate driver transistor 610 receives an input signal at its gate and drives the gate of the external NMOS transistor 620 with a desired voltage and current. A load 640 is connected between the drain of the NMOS transistor 620 and power supply 655. The power supply 655 is designated as $V_{bat}$, referring to a battery power supply. However, it will be appreciated that the power supply 655 can also comprise other, non-battery, power sources.

The drain pin (DRN) 645 of the gate driver integrated circuit 645 is used to monitor the drain voltage $V_d$ of the NMOS transistor 620. The drain voltage $V_d$ is provided to a comparator 650 which compares the drain voltage to a predetermined reference voltage $V_{REF}$ that is representative of a short circuit condition between the drain and the power supply 655. The comparator outputs a signal, labelled SCB (short circuit to battery) in FIG. 6, that indicates if the drain is short circuited to the power supply 655. Illustratively, if the drain voltage is greater than the reference voltage, SCB=1, otherwise SCB=0. The SCB signal is provided to AND gate 660, which receives its other input from comparator 655. As will be described in greater detail below, the output of comparator 655 is indicative of whether the gate voltage $V_g$ of the gate of the external NMOS transistor 620 is either in a Miller plateau or otherwise being charged. Specifically, the comparator 655 outputs a logical "0" if the external transistor gate voltage $V_g$ is either in a Miller plateau or otherwise charging, and outputs a logical "1" if $V_g$ is not in a Miller plateau or otherwise charging. The AND gate 660 outputs a logical "1" if both inputs are "1" and otherwise outputs a "0." Thus the AND gate only provides a logical "1" to the control circuitry 665 if SCB=1 (indicating a drain-to-power-supply short circuit) and the output of comparator 655 equals 1 (indicating that $V_g$ of transistor 620 is not in a Miller plateau nor otherwise charging). If, on the other hand, the gate voltage $V_g$ of transistor 620 IS either in a Miller plateau or otherwise charging, the comparator 655 will provide a logical "0" to the AND gate 660, effectively masking the short-circuit-to-battery signal SCB, because if the output of comparator 655 is a "0," the output of the AND gate will be "0" regardless of the value of SCB. If the signal that the control circuitry 665 receives from the AND gate is a logical "1," the control circuitry 665 pulls the voltage of the gate pin 615 low in order to turn off the external transistor 620 and prevent or limit damage to the external transistor 620 due to overheating.

The comparator 655 determines whether the gate voltage $V_g$ of the external NMOS transistor 620 is either in a Miller plateau or otherwise charging by comparing the voltages of the source and drain of the PMOS gate driver transistor 610. If there is a sufficient voltage drop, i.e. an amount greater than a threshold amount $V_{th}$ 560, across the gate driver transistor 610, that means that current is flowing from the source to the drain of the PMOS transistor 610 and, in turn, to the gate of the external NMOS transistor 620, which, in turn, means that the gate voltage $V_g$ of the external transistor 620 is either charging or in a Miller plateau. The source voltage $V_s$ of the PMOS gate driver transistor 610 is applied to the inverting input of comparator 655. A threshold voltage 560 is added to the drain voltage $V_d$ of transistor 610 and the result is applied to the non-inverting input of comparator 655. Thus the comparator outputs a logical "0" if $V_s$ is greater than $V_d$ by at least the threshold amount, indicating current across the gate driver transistor 610 and to the gate of the external NMOS 620.

It is noted that illustrative aspects of the present disclosure are described with reference to FIG. 6 with respect to an NMOS external transistor 620. It will be appreciated by those of skill in the art that, while the inherent differences between NMOS and PMOS transistors call for corresponding differences in the associated driver circuitry, the features shown and described in FIG. 6, and in other parts of this disclosure, with respect to an NMOS external transistor apply equally to driving an external PMOS transistor.

Figure 7:
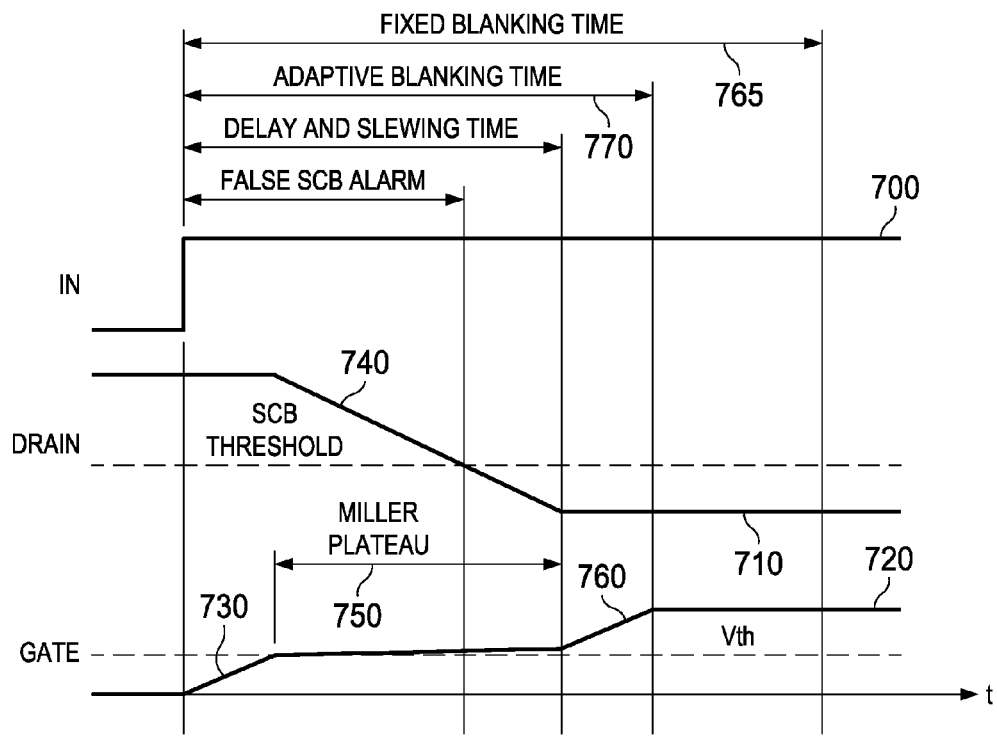
FIG. 7 is a timing diagram representing the values of an input signal provided to the gate of a gate driver transistor, the drain voltage of an external transistor, and the gate voltage of the external transistor during a normal switching-on of the external transistor, using an adaptive masking time.

FIG. 7 is a timing chart representing the values of the input signal 700 provided to the gate of a gate driver transistor 610, the drain voltage $V_d$ 710 of an external NMOS transistor 620, and the gate voltage $V_g$ 720 of the external transistor 620 during a normal switching-on of the external NMOS transistor 620, using an adaptive masking time. When an input signal 700 is applied to the gate of the gate driver transistor 610, the gate voltage $V_g$ of the external transistor 620 gradually begins to charge, as shown at 730 in FIG. 7. Due to the current flowing through the gate driver transistor 610 and to the gate of external NMOS 620, the comparator 655 will mask the short-circuit-to-battery signal SCB by providing a logical "0" to the AND gate 660. When the gate voltage $V_g$ 710 reaches the on/off threshold $V_{th}$ of the external transistor 620, the transistor begins conducting and therefore the drain voltage $V_d$ 710 begins dropping, as shown at 740. During the time that the drain voltage $V_d$ 210 is discharging, the gate voltage $V_g$ enters a Miller plateau 750. Current continues to flow from the gate drive transistor 610 to the gate of the external transistor 620 during the Miller plateau, and therefore the comparator 655 will continue to mask the SCB signal by providing a logical "0" to the AND gate 660. Once the drain voltage $V_d$ has dropped to its minimum value, turning the transistor 620 fully on, the gate voltage $V_g$ exits the Miller plateau stage and starts rising again, as shown at 760 in FIG. 7, until the gate becomes fully charged. In the illustrative embodiment of FIGS. 6 and 7, the comparator 655 will continue to mask the SCB signal until the gate of the external transistor 620 is fully charged by providing a logical "0" to the AND gate 660, since current continues to flow from the gate drive transistor 610 to the gate of the external transistor 620 until the gate of the external transistor 620 is fully charged.

Note that in other embodiments that use different methods of detecting the Miller plateau, the masking of the short-circuit-to-battery signal SCB ceases after or shortly after the end of the Miller plateau 750. But in the embodiment of FIGS. 6 and 7, the masking ends when the gate of the external transistor becomes fully charged, as current stops flowing to the gate of NMOS 620 at that time. Thus the adaptive blanking time 770 of FIG. 7 lasts from the start of the switching-on phase until the gate of the external transistor 620 is fully charged. It will be noted that this masking time is more than sufficient to cover the time period in which the drain voltage $V_d$ is greater than the SCB threshold ($V_{REF}$), which would trigger a false short circuit alarm in the absence of the masking activity. It is further noted that, even in embodiments where the masking stops immediately at the end of the Miller plateau 750, the masking time is plenty long enough to cover the time period in which the drain voltage $V_d$ is greater than the SCB threshold ($V_{REF}$). It is still further noted that, even in the embodiment of FIGS. 6 and 7, wherein the masking time lasts until the gate voltage is fully charged, the masking time is materially shorter than a representative fixed masking time, shown in FIG. 7 at 765.

Figure 8:
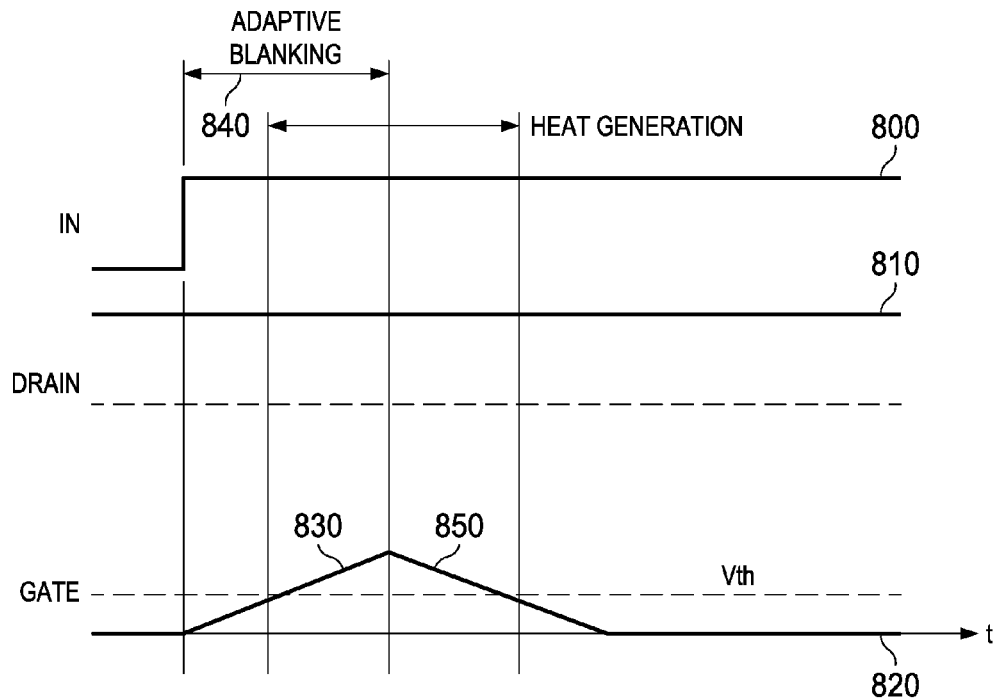
FIG. 8 is a timing diagram representing the values of an input signal provided to the gate of a gate driver transistor, the drain voltage of an external transistor, and the gate voltage of the external transistor during a switching-on of the external transistor while there is a short circuit between the drain of the transistor and the power supply, using an adaptive masking time.

FIG. 8 is a timing chart representing the values of the input signal 800 provided to the gate of the gate driver transistor 610, the drain voltage $V_d$ 810 of the external transistor 620, and the gate voltage $V_g$ 820 of the external transistor 620 during a switching-on of the external NMOS transistor 620 while there is a short circuit between the drain of the transistor 620 and the power supply 655, using an adaptive masking time. In the illustrative example of FIG. 8, there is a short circuit condition existing between the drain of the external transistor 620 and the power supply 655 prior to the assertion of the ON signal at the gate of the gate driver transistor 610. When the input signal 800 goes high, the gate voltage $V_g$ of the external transistor 620 begins to charge, as shown in FIG. 8 at 830. Due to the current flowing through the gate driver transistor 610 and to the gate of external NMOS 620, the comparator 655 will mask the short-circuit-to-battery signal SCB by providing a logical "0" to the AND gate 660. When the gate voltage $V_g$ 810 reaches the on/off threshold $V_{th}$ of the transistor 620, the transistor begins conducting but the drain voltage $V_d$ 810 remains at the voltage level of the power supply 655 due to the short circuit condition. Because the drain voltage $V_d$ does not fall, there is no Miller plateau in the gate voltage $V_g$ and the gate voltage $V_g$ continues to rise until the gate is fully charged.

As soon as the gate voltage $V_g$ crosses the on/off threshold $V_{th}$, significant amounts of heat begin being generated in the transistor 620 because the transistor is conducting with the drain voltage $V_d$ at the elevated level of the power supply voltage. In the illustrative embodiment of FIGS. 6 and 8, the comparator 655 will continue to mask the SCB signal until the gate of the external transistor 620 is fully charged by providing a logical "0" to the AND gate 660, since current continues to flow from the gate drive transistor 610 to the gate of the external transistor 620 until the gate of the external transistor 620 is fully charged. The masking ends when the gate of the external transistor 620 becomes fully charged, as current stops flowing to the gate of NMOS 620 at that time. Thus the adaptive blanking time 840 of FIG. 8 lasts from the start of the switching-on phase until the gate of the external transistor 620 is fully charged. When the blanking time 840 expires, the control circuit 160 detects the short circuit condition indicated by the SCB signal and pulls the voltage of the gate pin 115 low. The gate voltage $V_g$ 820 of the external transistor 620 then begins dropping at a rate that is limited by the discharging of the parasitic capacitances $C_{gd}$ 130 and $C_{gs}$ 135. When $V_g$ 820 drops below the on/off threshold $V_{th}$, the transistor 620 stops conducting, putting an end to the heat generation caused by the short circuit condition. Thus, the short circuit condition in the presence of the short circuit masking results in heat generation from a time period starting when $V_g$ rises above $V_{th}$ and ending when $V_g$ drops below $V_{th}$ again. Comparing FIG. 8 to FIG. 3, it can be seen that the adaptive masking of the present disclosure can significantly limit the heat generation relative to systems that employ a fixed blanking timer.

It is noted that the embodiments disclosed herein are illustrative rather than limiting in nature and that a wide range of variations, modifications, changes, and substitutions are contemplated in the foregoing disclosure. Furthermore, in some instances, some features may be employed without a corresponding use of the other features. Accordingly, it is appropriate that the appended claims be construed broadly and in a manner consistent with the broad inventive concepts disclosed herein.

What is claimed is:

1. A gate driver integrated circuit for driving an external n-type MOSFET (NMOS) transistor having a gate, a drain and a source, the drain being coupled through a load to a power supply, the gate driver integrated circuit comprising:
   a gate driver output configured to drive the gate of the external NMOS transistor;
   a first comparator operable to receive the drain voltage of the external NMOS transistor and compare it to a reference voltage representative of a short circuit condition between the drain and the power supply, the first comparator being configured to output a first value if the drain voltage is greater than the reference voltage and to output a second value if the drain voltage is less than or equal to the reference voltage;
   control circuitry configured to receive the output of the first comparator and to pull the voltage of the gate driver output low if the comparator output is of the first value;
   adaptive masking circuitry operable, upon an application of an "on" signal to the gate driver output, to mask the output of the first comparator such that a condition of the drain voltage being greater than the reference voltage does not cause the control circuitry to pull the voltage of the gate driver output low, the adaptive masking circuitry being operable to detect a Miller plateau in the gate voltage of the external NMOS transistor, wherein the adaptive masking circuitry is operable to stop masking the output of the first comparator after the end of said Miller plateau.

2. The gate driver integrated circuit of claim 1, wherein if the adaptive masking circuitry fails to detect a Miller plateau in the gate voltage of the external NMOS transistor, the adaptive masking circuitry is operable to stop masking the comparator output after the gate of the external NMOS transistor becomes fully charged.

3. The gate driver integrated circuit of claim 1, wherein said masking of the output of the first comparator by the adaptive masking circuitry comprises preventing said first value of the comparator output from being provided to the control circuitry.

4. The gate driver integrated circuit of claim 1, further comprising a gate driver MOSFET transistor configured to receive an input signal at its gate and to provide a gate driver signal to the gate driver output of the gate driver integrated circuit.

5. The gate driver integrated circuit of claim 4, wherein the adaptive masking circuitry comprises a second comparator operable to compare the drain voltage and source voltage of the gate driver MOSFET, wherein the second comparator is operable to output a first value if the difference between the drain voltage and source voltage is less than a predetermined threshold value, and to output a second value if the difference between the drain voltage and source voltage is greater than the predetermined threshold value, wherein if the output of the second comparator comprises said second value, the adaptive masking circuitry is operable to prevent the first value of the output of the first comparator from being provided to the control circuitry.

6. The gate driver integrated circuit of claim 5, wherein said first output value of the first comparator is a logical "1," said second output value of the first comparator is a logical "0," said first output value of the second comparator is a logical "1," and said second output value of the second comparator is a logical "0," and wherein the adaptive masking circuitry further comprises an AND gate having a first input that receives the output of the first comparator, a second input that receives the output of the second comparator, and an output that is provided to the control circuitry, wherein the control circuitry is operable to pull the voltage of the gate driver output low if the output of the AND gate is a logical "1".

* * * * *